United States Patent [19]

Okazawa

[11] Patent Number: 4,980,732

[45] Date of Patent: Dec. 25, 1990

[54] SEMICONDUCTOR DEVICE HAVING AN IMPROVED THIN FILM TRANSISTOR

[75] Inventor: Takeshi Okazawa, Tokyo, Japan

[73] Assignee: NEC Corporation, Tokyo, Japan

[21] Appl. No.: 259,002

[22] Filed: Oct. 17, 1988

[30] Foreign Application Priority Data

Oct. 15, 1987 [JP] Japan .................................. 62-260924

[51] Int. Cl.[5] ........................................... H01L 29/78
[52] U.S. Cl. .................... 357/23.5; 357/54; 357/42; 357/23.1; 357/23.7; 357/59
[58] Field of Search ....................... 357/23.5, 59 I, 42, 357/23.7, 23.1

[56] References Cited

U.S. PATENT DOCUMENTS

| 4,272,880 | 6/1981 | Pashley | 357/23.7 |
|---|---|---|---|
| 4,603,468 | 8/1986 | Lam | 357/42 |
| 4,619,034 | 10/1986 | Janning | 357/23.7 |
| 4,628,589 | 12/1986 | Sundaresan | 357/23.7 |
| 4,653,025 | 3/1987 | Minato et al. | 357/23.7 |
| 4,654,121 | 3/1987 | Miller et al. | 357/23.7 |
| 4,679,299 | 7/1987 | Szluk et al. | 357/23.7 |
| 4,698,659 | 10/1987 | Mitzutani | 357/23.7 |
| 4,771,323 | 9/1988 | Sasaki | 357/23.7 |

FOREIGN PATENT DOCUMENTS

| 0204171 | 12/1982 | Japan | 357/23.7 |
|---|---|---|---|
| 0134059 | 6/1986 | Japan | 357/23.7 |
| 0139056 | 6/1986 | Japan | 357/23.7 |
| 0122262 | 5/1988 | Japan | 357/42 |

Primary Examiner—Rolf Hille
Assistant Examiner—Minh Loan Tran
Attorney, Agent, or Firm—Sughrue, Mion, Zinn, Macpeak & Seas

[57] ABSTRACT

There is disclosed a semiconductor device provided with an improved thin film transistor which is formed on a semiconductor substrate via an insulating layer and which comprises a gate electrode, a semiconductor film, a source region and a drain region formed in the semiconductor film, a junction between the drain region and a channel region being not overlapped with the gate electrode.

15 Claims, 2 Drawing Sheets

SEMICONDUCTOR DEVICE HAVING AN IMPROVED THIN FILM TRANSISTOR

BACKGROUND OF THE INVENTION

1. Field of the Invention

The present invention relates to a semiconductor device and more particularly to a static type semiconductor memory device.

2. Description of the Related Art

Heretofore, different types of semiconductor devices, which can store binary information or data in terms of electric charges, have been developed and are at present used in various memories such as static memories, dynamic memories, read only memories (ROMs), or the like. The reason for this is that a semiconductor memory having high integration density and large storage capacity can be easily obtained because each memory cell can be formed with a very small area. Among these memories, the static type semiconductor memory has been widely used as a random access memory (RAM), because it can retain stored data without periodical refresh operation.

The static random access memory (SRAM) can be implemented by a large number of flip-flop circuit each of which stores one bit of information. Recently, a CMOS flip-flop circuit which is composed of a pair of N-channel MOS field effect transistors and a pair of P-channel MOS field effect transistors is widely utilized as a memory cell because power consumption of the CMOS flip-flop circuit is very small. However, the CMOS flip-flop circuit generally necessitates a relatively large area on a semiconductor substrate, and therefore it is difficult to fabricate a large capacity of SRAM by employing the CMOS flip-flop.

In order to solve the above problem, it has been proposed to form a pair of P-channel MOS transistors of the CMOS flip-flop circuit as thin film transistors (TFTs) or by silicon-on-insulator (SOI) structure. According to the TFT or SOI technique, the N channel MOS transistors are formed at a surface of a semiconductor substrate and the P-channel MOS transistors are fabricated by a polycrystalline silicon layer or a monocrystalline silicon layer which is formed on the surface of the semiconductor substrate via an insulating layer. According to this technique, the P-channel transistors can overlap a part of the N-channel MOS transistors, and therefore the integration scale of SRAM is enlarged. However, crystalline characteristic of the polycrystalline silicon film or the monocrystalline silicon film formed on the semiconductor substrate via an insulating layer is not good and a PN junction formed in the above silicon film is very leaky. Therefore, power consumption of the SRAM employing the above SOI type transistors is relatively large.

SUMMARY OF THE INVENTION

It is an object of the present invention to provide a semiconductor device having an improved thin film transistor.

It is another object of the present invention to provide a semiconductor memory device employing an improved CMOS flip-flop circuit operable by a small leak current.

The semiconductor device according to the present invention comprises a semiconductor substrate, a first insulating layer formed on the semiconductor substrate and a thin film insulated gate field effect transistor formed on the substrate via the first insulating layer, the thin film transistor having a gate electrode, a semiconductor film, and a source region and a drain region formed in the semiconductor film, and is featured in that the drain-channel junction is located apart from the gate electrode and is not overlapped with the gate electrode.

According to the present invention, the drain-channel junction is distanced from the gate electrode and is not affected by electric field caused by the gate electrode. Accordingly, an amount of the leak current flowing through the drain-channel junction can be effectively reduced. Therefore, the thin film transistor according to the present invention can provide a large resistance particularly when it is non-conductive.

The above advantage is particularly significant to reduce a total power consumption of a static memory device by employing the above thin film transistor as load transistors in memory cell.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Figure 1:
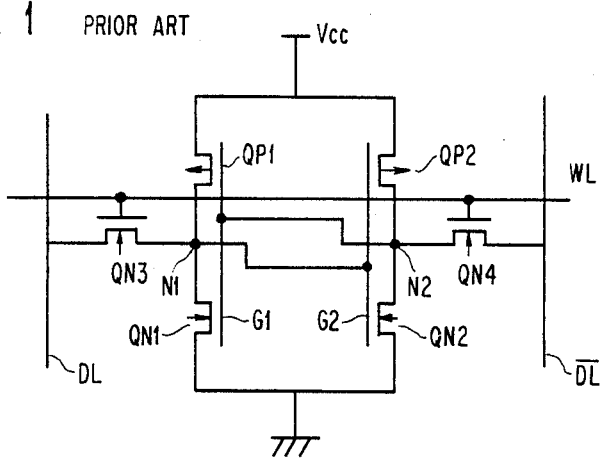
FIG. 1 is a schematic circuit diagram of a CMOS static memory cell.

A general circuit structure of the CMOS type static memory cell is shown in FIG. 1. In FIG. 1, N-channel MOS transistors QN1, QN2 and P-channel MOS transistors QP1 and QP2 form a CMOS flip-flop circuit in which the transistors QP1 and QN1 having electrically common gates G1 form a first CMOS inverter and the transistors QP2 and QN2 having electrically common gates G2 form a second CMOS inverter. Output nodes N1 and N2 of the first and second CMOS inverters are connected to a pair of digit lines DL and $\overline{DL}$ via a pair of N-channel transfer gate transistors QN3 and QN4 controlled by a word line, respectively.

The sectional structure of the first inverter which is composed of the P-channel transistors QP1 and the N-channel transistor QN1 in FIG. 1. In the SRAM of a high density of integration, the P-channel transistors within the cell is constructed by the SOI technique in order to reduce the occupation area of the cell. To this end, in FIG. 2, a P-type silicon substrate 10 is overlaid with a gate insulator film 16, on which a gate electrode 14 of a polycrystalline silicon is formed. In the parts of the silicon substrate 10 on both the sides of the gate electrode 14, N-type diffused regions 14A and 14B at an impurity concentration of $10^{20}$–$10^{21}$ cm$^{-3}$ are formed as source and drain regions of the transistor QN1. The gate electrode 14 and the N-type diffused regions 14A, 14B constitute the N-channel transistor QN1 in FIG. 1. Accordingly, the N-type diffused region 14A is connected to the ground potential. Meanwhile, in FIG. 2, a gate insulator film 17 is also formed on the gate electrode 14, and an N-type silicon thin film 13 is formed on the gate insulator films 16 and 17. P-type diffused regions 13S and 13D of an impurity concentration of $10^{19}$–$10^{21}$ cm$^{-3}$ are formed in the parts of the silicon thin film 13 on both the sides of the gate electrode 14, and the P-channel transistor QP1 in FIG. 1 is formed by the SOI structure by the gate electrode 14 and the P-type diffused regions 13S, 13D. Here, the P-type diffused layer 13S is connected to the power source potential Vcc by a lead-out electrode 11 of aluminum. Besides, the P-type diffused layer 13D and the N-type diffused region 14B are connected by a conductive layer 18 of aluminum at the node N1. Further, symbols 12A, 12B and 12C denote thick insulator films, and numeral 15 denotes a part of the gate electrode G2 of the second inverter which is configured of the P-channel transistor QP2 and the N-channel transistor QN2 in FIG. 1.

In the memory cell of the above CMOS-type SRAM having the prior-art SOI structure, the P-channel is formed in the silicon thin film which is formed on the silicon substrate via the insulator film 16. However, such a silicon thin film is usually made of polycrystalline silicon or recrystallized silicon somewhat single-crystallized, which has such a problem that junction leakages in the P-channel transistors are more than in perfect single-crystal or monocrystalline silicon. In particular, the P-N junctions of the source and drain regions 13S, 13D overlap the gate electrode 14, and the leakages of the junctions are more liable to occur. Especially concerning the SRAM, the problem of the junction leakages has been a disadvantage leading to the increase of a power consumption in a data holding state.

Figure 3:
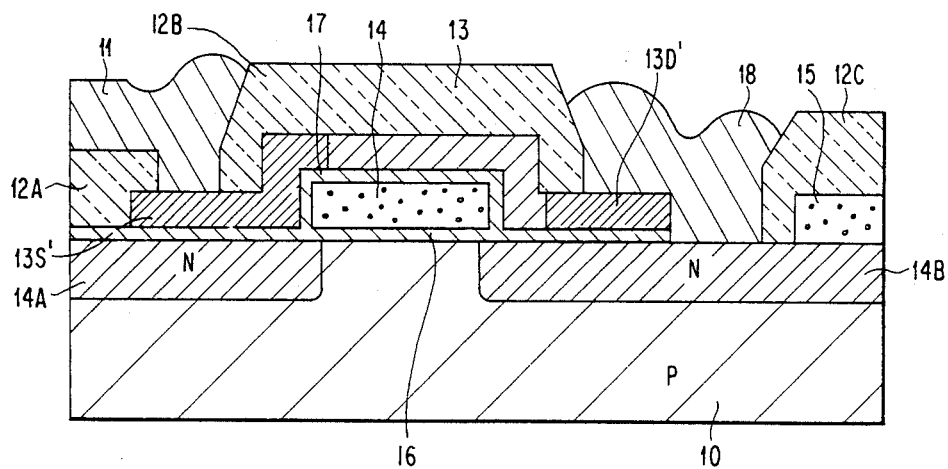
FIG. 3 is a sectional view of a part of the CMOS static memory cell according to a first embodiment of the present invention.

With reference to FIG. 3, first embodiment of the present invention will be explained.

Figure 2:
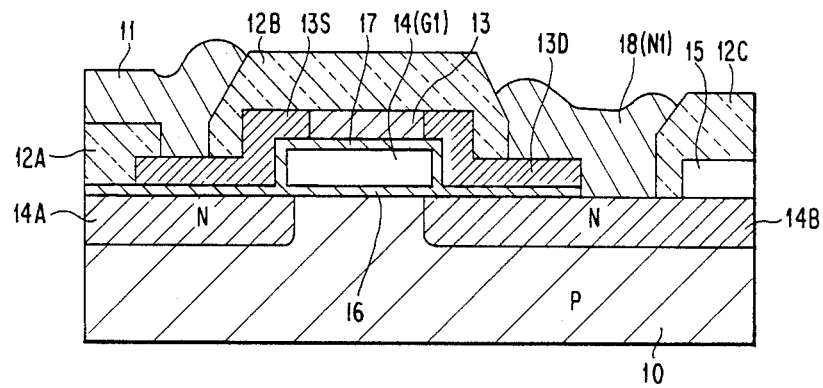
FIG. 2 is a sectional view of a part of the CMOS static memory cell in the prior art.

In FIG. 3, the portions or elements corresponding to those in FIG. 2 are denoted by the same or similar references, and the structure of the first inverter will be exemplified. However, the second inverter in FIG. 1 can be fabricated in the same structure of the first inverter, as in FIG. 3.

As shown in FIG. 3, a gate electrode 14 (G1) of polycrystalline silicon is formed on a silicon substrate 10 of the P-type via a gate insulator film 16, and N-type diffused regions 14A and 14B of an impurity concentration of $10^{20}$–$10^{21}$ cm$^{-3}$ are formed in the silicon substrate 10 so as to be self-aligned with the gate electrode 14. The N-channel transistor QN1 in FIG. 1 is configured of the gate electrode 14 and the N-type diffused regions 14A, and 14B. Accordingly, the N-type diffused region 14A is connected to the ground potential by way of example. Meanwhile, the surface of the gate electrode 14 is covered with a gate insulator film 17 of silicon dioxide, a polycrystalline silicon thin film 13 of the N-type is formed on the gate insulator films 16 and 17, and P-type diffused regions 13S and 13D' of an impurity concentration of $10^{19}$–$10^{21}$ cm$^{-3}$ are formed in the parts of the silicon thin film 13 on both the sides of the gate electrode 14. The P-channel transistors QP1 in FIG. 1 is formed by the SOI structure by the gate electrode 14 and the P-type diffused regions 13S, 13D' serving as the source and drain of QP1. The P-type diffused region 13S is connected to the power source potential through a lead-out electrode 11. On the other hand, the P-type diffused layer 13D' is connected with the N-type diffused region 14B at the node N1 by a conductive layer 18.

Here in FIG. 3, the P-type diffused region 13D' of the P-type diffused regions 13S and 13D of the P-channel transistor QP1 which is connected to the power source potential serves as a source, while the P-type diffused layer 13D on the opposite side serves as a drain. As illustrated in FIG. 3, one end of the drain P-type diffused region 13D i.e. a PN junction between the region 13—13D' is formed at a spacing of, for example, about 0.2–0.5 micron from the facing end of the gate electrode 14. As a result, the P-channel transistor QP1 having the drain-gate offset structure is obtained. It is needless to say that, although not depicted in FIG. 3, the drain 13' of the P-channel transistor QP2 in the second inverter (QP2, QN2) shown in FIG. 1 is also formed with the offset gate-drain structure.

In this embodiment, the N-channel transistor QN1 is formed in the P-type silicon substrate 10, and the P-channel transistor QP1 is constructed in the silicon thin film. In this regard, even when an N-type silicon substrate is employed, the present invention can, of course, be similarly applied by rendering the conductivity types of transistors opposite.

According to this embodiment, the leaky PN junction formed between the N-type channel region 13 and the P-type drain region 13D' is not located in the same plane of the gate electrode 14, the leak current path at the above PN junction is not affected by the potential of the gate electrode 14 and therefore amount of the leak current at the drain junction can be effectively reduced.

Figure 4:
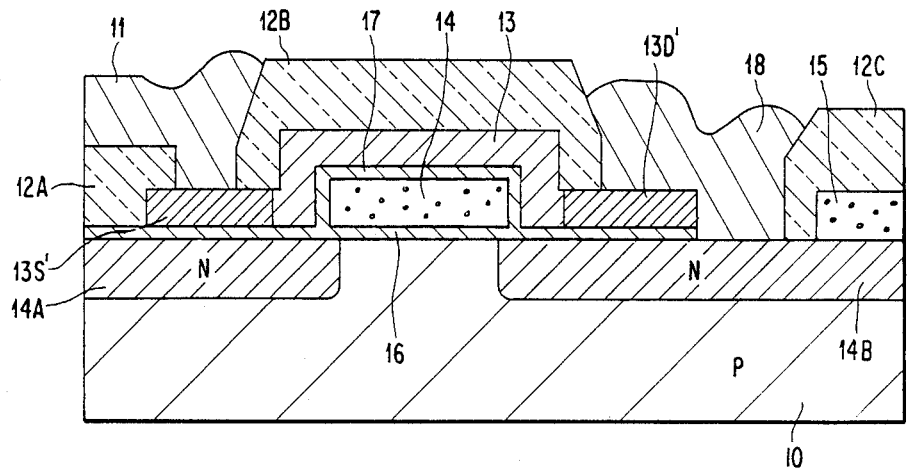
FIG. 4 is a sectional view of a part of the CMOS static memory cell according to a second embodiment of the present invention.

A modification of the embodiment of FIG. 3 will be explained with reference to FIG. 4. As shown in FIG. 4, the P-type source diffusion region 13S' is also spaced from the gate electrode 14. Thus, the gate electrode does not overlap the source region, either, and a leakage current can be reduced still more.

Figure 5:
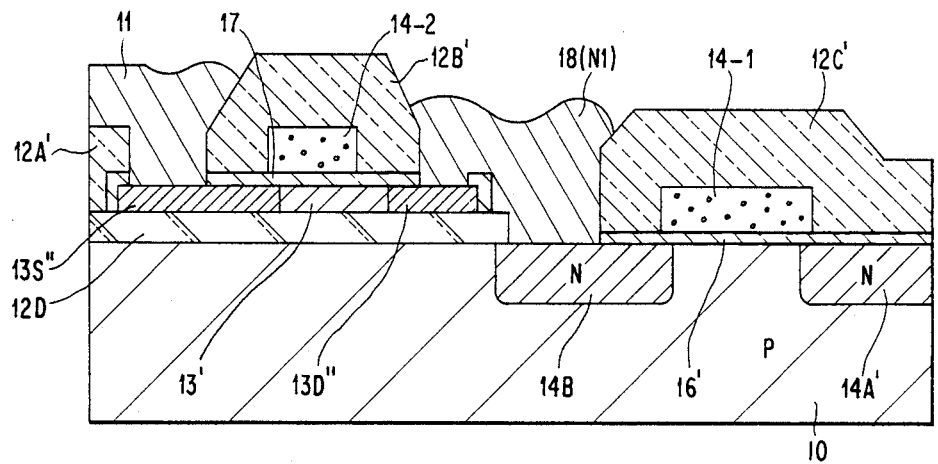
FIG. 5 is a sectional view of a part of the CMOS static memory cell according to a third embodiment of the present invention.

FIG. 5 is a vertical sectional view of a third embodiment of the present invention. A gate electrode 14-1 of polycrystalline silicon as the gate of the N-channel transistor QN1 (QN2) is formed on a silicon substrate 10 of the P-type via a gate insulator film 16. N-type diffused regions 14A' and 14B are formed in the parts of the silicon substrate 10 on both the sides of the gate electrode 14, and the N-channel transistor QN1 (QN2) is configured of the gate electrode 14-1 and the N-type diffused regions 14A', 14B. Here, the N-type diffused region 14A' is connected to the ground potential. Meanwhile, a polycrystalline silicon thin film 13' is formed on the silicon substrate 10 through a thick insulator film 12D, and it is overlaid with a gate electrode 14-2 of polycrystalline silicon via a gate insulator film 17'. This gate electrode 14-2 serves as the gate of the P-channel transistor QP1 (QP2) and is electrically connected with the gate electrode 14-1. Besides, P-type diffused regions 13S" and 13D" are formed in the silicon thin film 13', as illustrated. The P-channel transistor QP1 (QP2) in FIG. 1 is formed as the SOI structure by the gate electrode 14-2 and the P-type diffused regions 13S", 13D". Here, the P-type diffused region 13S" serves as the source of QP1 and is connected to the power source potential through a lead-out electrode 11. The P-type diffused region 13D" serves as the drain of QP1 and is formed so as to be spaced, for example, about 0.2–0.5 micron from the gate electrode 14-2. In this embodiment, the P-channel transistor QP1 (QP2) is formed separately from the N-channel transistor QN1 (QN2), and similar effects are attained even with such a structure.

Figure 6:
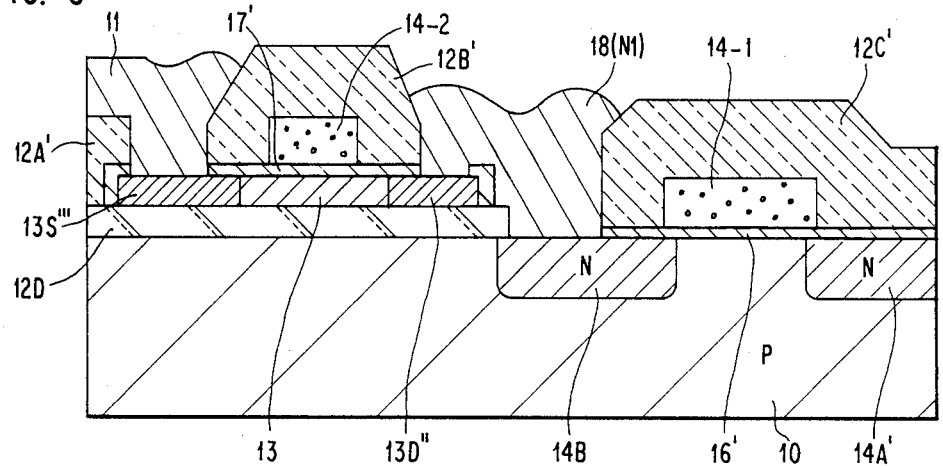
FIG. 6 is a sectional view of a part of the CMOS static memory cell.

FIG. 6 shows a modification of the embodiment in FIG. 5. A P-type diffused region 13S" in the silicon thin film 13 serving as the source of QP1 (QP2) is also spaced 0.2–0.5 micron from the gate electrode 14-2. Thus, no P-N junction is provided in the polycrystalline silicon thin film 13 underlying the gate electrode 14-2, and a leakage current can be reduced still more.

As described above, according to the present invention, in a case where the memory cell of a MOS-type SRAM is constructed by utilizing a thin film MOS transistor formed in a silicon thin film, the junction leakage of the thin film transistor attributed to the imperfectness of the crystallinity of the silicon thin film can be mitigated in such a way that the drain of the thin film transistor, or the drain and source thereof is/are formed so as to be spaced a predetermined interval, or predetermined intervals from a gate electrode.

As a result, an electric field caused by the gate electrode is not applied to the drain junction of the thin film transistor, and the junction leakage can be reduced, to bring forth the effect that the consumption current of the MOS-type SRAM in the storage holding state thereof is diminished.

I claim:

1. A semiconductor device comprising a semiconductor substrate of a first conductivity type; a first insulating layer formed on said semiconductor substrate; and a thin film field effect transistor formed on said semiconductor substrate via said first insulating layer, said thin film field effect transistor including a gate electrode formed on said first insulating layer, a second insulating layer covering an upper surface and first and second side surfaces of said gate electrode, and a semiconductor film formed on said semiconductor substrate via said first and second insulating layers and having a first region of a second conductivity type opposite to said first conductivity type, a second region of said first conductivity type formed in contact with a first end of said first region, and a third region of said first conductivity type and formed in contact with a second end of said first region, said gate electrode and a part of said first region being overlapped with each other via said second insulating layer, said second end of said first region being apart from said second side surface of said gate electrode by a distance more than a thickness of a part of said second inslutating layer covering said second side surface of said gate electrode and being not overlapped with said gate electrode, wherein said second and third regions serves as a source and a drain of said thin film field effect transistor, respectively.

2. The semiconductor device according to claim 1, in which said first end of said first region is apart from said first side surface of said gate electrode by a distance more than a thickness of a part of said second insulating layer covering said first side surface of said gate electrode and is not overlapped with said gate electrode.

3. The semiconductor device according to claim 1, in which said semiconductor film is formed of a polycrystalline silicon layer.

4. The semicoductor device according to claim 1, in which said gate electrode is formed of polycrystalline silicon.

5. The semiconductor device according to claim 1, in which said first conductivity type is a P type and said second conductivity type is an N type.

6. The semiconductor device according to claim 1, in which said first region extends from a first location of said second insulating layer above said upper surface of said gate electrode to a second location of said first insulating layer on a side of said second side surface of said gate electrode along a surface of the part of said second insulating layer covering said second side surface of said gate electrode.

7. The semiconductor device according to claim 1, in which said first region is located above said upper surface of said gate electrode above said upper surface of said gate electrode and on said second side surface of said gate electrode via said second insulating layer.

8. A semiconductor device comprising a semiconductor substrate of a first conductivity type, a first region of a second, conductivity type formed in said semiconductor substrate, a second region of said second conductivity type formed in said semiconductor substrate and being apart from said first region, a first insulating layer formed on a surface of said semiconductor substrate, a gate electrode formed on a part of the surface of said semiconductor substrate approximately between said first and second regions via said first insulating layer, a second insulating layer covering an upper surface and first and second side surfaces of said gate electrode, a semiconductor film formed on the surface of said gate electrode and said semiconductor substrate via said second and first insulating layers, said semiconductor film having a third region of said second conductivity type, a fourth region of said first conductivity type adjacent to a first end of said third region and a fifth region of said first conductivity type adjacent to a second end of said third region, a part of said third region being overlapped with said gate electrode, said second end of said third region being apart from said second side surface of said gate electrode by a distance more than a thickness of a part of said second insulating layer covering said second side surface and being not overlapped with said gate electrode, and means for electrically connecting said fifth region to said second region, wherein said first region and said second region serve as a source and a drain of a first field effect transistor of a first channel type and said fourth region and said fifth region service as a source and a drain of a second field effect transistor of a second channel type opposite to said first channel type.

9. The semiconductor device according to claim 8, in which said first end of said third region is apart from said first side surface of said gate electrode by a distance more than a thickness of a part of said second insulating layer covering said first side surface of said gate electrode and is not overlapped with said gate electrode.

10. The semiconductor device according to claim 8, in which said semiconductor film is formed of polycrystalline silicon.

11. The semiconductor device according to claim 8, in which said third region extends from a first location above said upper surface of said gate electrode to a second location above said second region along said second side surface of said gate electrode via said second insulating layer.

12. A semiconductor device including a plurality of static memory cells formed in a semiconductor substrate of a first conductivity type, each of said static memory cells comprising a flip-flop circuit including first and second inverters, input terminals of said first and second inverters being connected to output terminals of said second and first inverters, respectively, each of said first and second inverters including a first insulated gate field effect transistor of a first channel type and a second insulated gate field effect transitor of a second channel type opposite to said first channel type, said first transistor having first and second separate regions formed in said substrate, a first insulating layer formed on a surface of said substrate and a conductive layer formed on a part of the surface of said substrate between said first and second regions, said second transistor having a second insulating layer covering an upper surface and first and second side surfaces of said conductive layer, a semiconductor film formed on said conductive layer and said substrate via said second and first insulating layers, said semiconductor layer having a third region of said second conductivity type, a fourth region of said first conductivity type adjacent to a first end of said third region and a fifth region of said first conductivity type adjacent to a second end of said third region, a part of said third region being overlapped with said conductive layer, said second end of said third region being apart from said second side surface of said conductive layer by a distance more than a thickness of a part of said second insulating layer covering said second side surface and not overlapped with said conductive layer, wherein said fifth region and said fourth region serve as a drain and a source of said second transistor, respectively and said conductive layer serves as gates of said first and second transistors.

13. The semiconductor device according to claim 12, in which said first end of said third region is apart from said first side surface of said conductive layer by a distance more than a thickness of a part of said second insulating layer covering said first side surface of said conductive layer and is not overlapped with said conductive layer.

14. The semiconductor device according to claim 12, in which said semiconductor film is formed of polycrystalline silicon.

15. The semiconductor device according to claim 12, in which said third region extends from a first location above said upper surface of said gate electrode to a second location above said second region along said second side surface of said gate electrode via said second insulating layer.

* * * * *

UNITED STATES PATENT AND TRADEMARK OFFICE
CERTIFICATE OF CORRECTION

PATENT NO. : 4,980,732

DATED : December 25, 1990

INVENTOR(S) : Takeshi OKAZAWA

It is certified that error appears in the above-identified patent and that said Letters Patent is hereby corrected as shown below:

Col. 5, line 4, delete "13S''" and insert --13S'''--.

Signed and Sealed this

Eighteenth Day of August, 1992

Attest:

DOUGLAS B. COMER

Attesting Officer

Acting Commissioner of Patents and Trademarks